US012598999B2

(12) United States Patent
Leobandung

(10) Patent No.: US 12,598,999 B2
(45) Date of Patent: Apr. 7, 2026

(54) MULTI-CHIP DIE ALIGNMENT

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 624 days.

(21) Appl. No.: 17/664,436

(22) Filed: May 23, 2022

(65) Prior Publication Data

US 2023/0378081 A1    Nov. 23, 2023

(51) Int. Cl.
| | |
|---|---|
| *H01L 23/544* | (2006.01) |
| *G03F 9/00* | (2006.01) |
| *H01L 23/00* | (2006.01) |
| *H01L 25/065* | (2023.01) |
| *H10W 46/00* | (2026.01) |
| *H10W 90/00* | (2026.01) |
| *H10W 72/00* | (2026.01) |
| *H10W 72/20* | (2026.01) |

(52) U.S. Cl.
CPC .......... *H10W 46/00* (2026.01); *G03F 9/7042* (2013.01); *G03F 9/7046* (2013.01); *H10W 90/00* (2026.01); *H10W 46/301* (2026.01); *H10W 72/07221* (2026.01); *H10W 72/07231* (2026.01); *H10W 72/234* (2026.01); *H10W 72/242* (2026.01)

(58) Field of Classification Search
CPC ....... H01L 23/544; H01L 24/13; H01L 24/81; H01L 25/0655; H01L 2223/54426; H01L 2224/13018; H01L 2224/13021; H01L 2224/13023; H01L 2224/8112; H01L 2224/81897; H01L 2225/06593; H01L 23/481; H01L 24/80; H01L 2224/08146; H01L 2224/80139; H01L 2224/80895; H01L 2225/06541; G03F 9/7042; G03F 9/7046

See application file for complete search history.

(56) References Cited

U.S. PATENT DOCUMENTS

| | | | |
|---|---|---|---|
| 5,300,815 A | 4/1994 | Rostoker | |
| 6,537,852 B2 | 3/2003 | Cohn | |
| 7,371,973 B1 | 5/2008 | Taran | |
| 7,863,743 B1 | 1/2011 | Shi | |
| 8,659,161 B2 | 2/2014 | Krishnamoorthy | |
| 8,896,112 B2 | 11/2014 | Thacker | |
| 9,111,943 B2 | 8/2015 | Chow | |
| 9,715,064 B1 | 7/2017 | Gambino | |
| 2007/0194416 A1* | 8/2007 | Vora ...................... H01L 23/544 | 257/E25.013 |
| 2009/0085233 A1* | 4/2009 | Krishnamoorthy ..... H01L 23/48 | 257/E21.705 |
| 2013/0181339 A1 | 7/2013 | Fan | |
| 2019/0326161 A1* | 10/2019 | Kelly ...................... H01L 24/95 | |
| 2020/0203188 A1* | 6/2020 | Chew ................... H01L 23/295 | |

* cited by examiner

*Primary Examiner* — Britt Hanley
*Assistant Examiner* — William C. Trice, III
(74) *Attorney, Agent, or Firm* — Gavin Giraud

(57) ABSTRACT

Aspects of the present invention provide a semiconductor structure. The semiconductor structure may include a substrate having a first substrate alignment structure. The semiconductor structure may also include a first die with a first die alignment structure. The first die may be attached to the substrate with the first substrate alignment structure matched to the first die alignment structure.

10 Claims, 9 Drawing Sheets

MULTI-CHIP DIE ALIGNMENT

TECHNICAL FIELD

The present invention relates generally to the field of chip alignment, and more particularly to utilizing an alignment structure of holes and spikes to combine dies on a substrate.

BACKGROUND

Multi die Wafer level packaging (MDWLP) is the technology of packaging dies, along with protective layers and electrical connections, to a substrate of an integrated circuit (IC) wafer before the IC wafer is diced into individual chips. MDWLP differs from other packaging techniques, where wafers are diced into individual chips, then packaged with the dies, protective layers, and electrical connections. Utilizing MDWLP technology allows further reduction of the size of the individual chips, streamlines manufacturing, and provides easier ways to test chip functionality. In MDWLP, top layers and bottom layers of the packaging components and the solder bumps are attached to a reconstructed wafer. This process again differs from a conventional process, in which the wafer is sliced into individual circuits (dice) before the packaging components are attached.

MDWLP results in a package that can be similar in size to the die. Multi die Wafer level packaging allows integration of wafer fab, packaging, test, and burn-in at wafer level in order to streamline the manufacturing process undergone by a device from silicon start to customer shipment. One example of MDWLP used in optics is the CCD sensor used in certain smartphone cameras.

SUMMARY

In one aspect, the present invention provides a semiconductor structure. The semiconductor structure may include a substrate having a first substrate alignment structure. The semiconductor structure may also include a first die with a first die alignment structure. The first die may be attached to the substrate with the first substrate alignment structure matched to the first die alignment structure.

In another aspect, the present invention provides a method of forming a semiconductor structure. The method may include forming a first die alignment structure on a first die, forming a first substrate alignment structure on a substrate, and attaching the first die to the substrate. The first die alignment structure may align the first die to the substrate by matching with the first substrate alignment structure.

In yet another aspect, the present invention provides a semiconductor structure. The semiconductor structure may include a substrate that has first substrate alignment structures and second substrate alignment structures. The semiconductor structure may also include a first set of dies with first die alignment structures. The first set of dies may be attached to the substrate with the first die alignment structure matched to the first substrate alignment structure. The semiconductor structure may also include a second set of dies having second die alignment structures. The second die may be attached to the substrate with the second die alignment structures matched to the second substrate alignment structures.

DETAILED DESCRIPTION

Figures 1, 2:
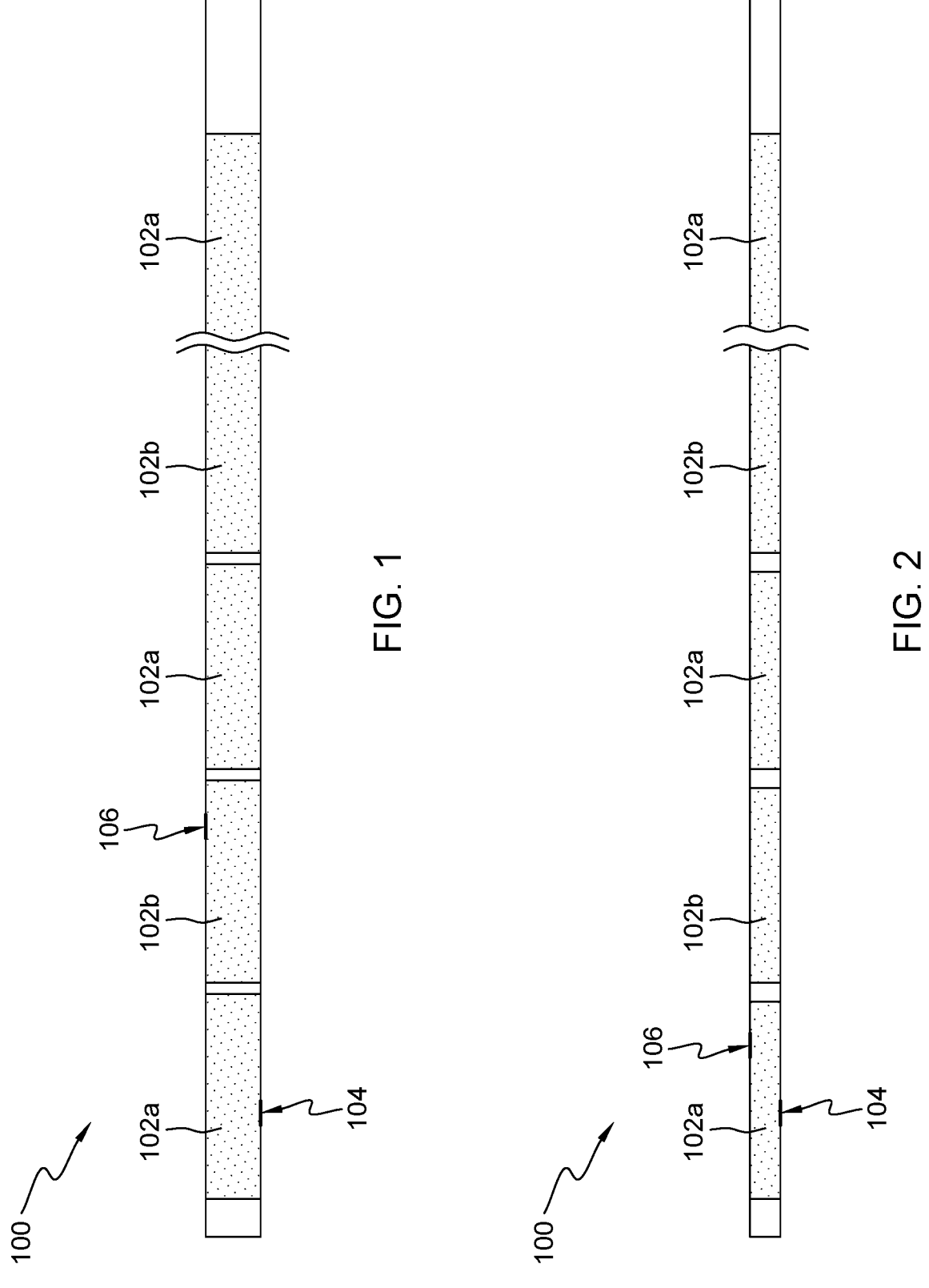
FIG. 1 depicts a cross-sectional schematic side view diagram of an integrated circuit (IC) wafer, in accordance with one embodiment of the present invention.
FIG. 2 depicts a cross-sectional schematic side view diagram of the IC wafer of FIG. 1, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical, and electrical changes may be made without departing from the described embodiments. The following detailed description is, therefore, not to be taken in a limiting sense, and the included embodiments are defined by the appended claims.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. Each reference number may refer to an item individually or collectively as a group. For example, die 102 may refer to a single die 102 or multiple dies 102.

Multi die Wafer level packaging (MDWLP), as described above, enables dies and other components of an integrated circuit (IC) to be fabricated separately and then combined by attaching the components to a substrate with other components. The semiconductor industry does not currently have a standard method of MDWLP. One benefit of this approach is that the dies attached to the substrate may be selected or weeded out based on defects. That is, before being attached to the substrate, the dies may be tested so that only good dies are attached to the substrate of the reconstructed wafer. This multiple die fabrication process, however, can cause poor die registration. The wiring density of the reconstructed wafer can be limited due to the poor die registration.

The present invention will now be described in detail with reference to the Figures.

FIG. 1 depicts a cross-sectional schematic side view diagram of an integrated circuit (IC) wafer 100, in accordance with one embodiment of the present invention. FIG. 1 provides only an illustration of one embodiment and does not imply any limitations with regard to the environments in which different embodiments may be implemented.

In the depicted embodiment, the wafer 100 includes dies 102a, b. The semiconductor dies 102a, b (or chip) are the functional computation component of electronic products. The dies 102a, b contain integrated circuits of transistor devices, and the connections to control and power the transistor devices. The dies 102a, b may be designed according to a design methodology that includes the step of concurrently designing circuitry and a product circuitry in a unified design. The dies 102a, b may be tested individually for functioning of the transistor devices fabricated thereon. Testing may be completed through visual, electrical, or other inspection processes. Visual inspection may be done through magnification to determine whether there is any glassivation, passivation, or metallization. Also each die 102a, b has to be inspected to determine whether there is any presence of voids, corrosion (e.g., in a bond pad), die crack, or any contamination on surfaces of the dies 102a, b. Electrical testing may be completed using probes connected to each of the dies 102a, b to determine if the correct voltages and/or signals flow through the dies 102a, b.

The testing of the dies 102a, b enables each of the dies 102a, b to be identified as a good die 102a or a bad die 102b. That is, when each good die 102a is tested, the function of each transistor device, connection, and wiring performs up to standard, and when each bad die 102b is tested, the function of at least one transistor device, connection, or wiring does not perform up to standard. While the illustration shows alternate good die 102a and bad die 102b as alternating in location, in reality the mixture of good die 102a and bad die 102b are random. Some wafers can have all good die 102a or all bad die 102b.

FIG. 2 depicts a cross-sectional schematic side view diagram of the IC wafer 100 of FIG. 1 at a subsequent stage in the fabrication process, in accordance with one embodiment of the present invention. While not drawn to scale, the wafer 100 may be thinned and polished on a backside 104 to better enable connection of the transistor devices to the backside 104. That is, the transistor devices of each good die 102a may be fabricated on a front side 106 of the wafer 100, and may be connected to a substrate through the backside 104. The thinning of the wafer 100 may include removing more than ninety percent of the wafer 100. The wafer 100 may then be diced into the individual dies 102a, b, with the bad dies 102b being discarded or put to a different use.

Figure 3:
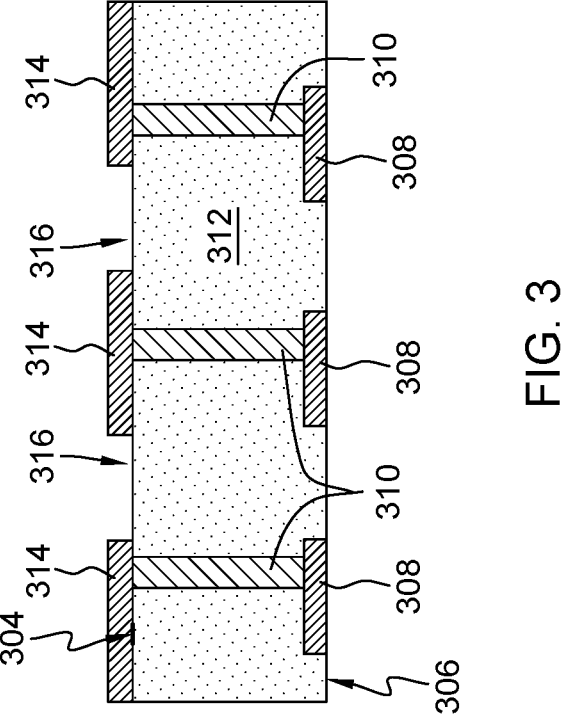
FIG. 3 depicts a cross-sectional schematic side view diagram of a die, in accordance with one embodiment of the present invention
Figure 3:
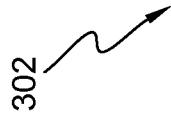

FIG. 3 depicts a cross-sectional schematic side view diagram of a die 302, in accordance with one embodiment of the present invention. The die 302 may have been fabricated as one die of an IC wafer, tested, and identified as a good die using the process outlined above. At the illustrated stage, the die 302 is flipped, so that a backside 304 is on the top of the die 302, and the front side 306 is on the bottom of the die 302. The front side 306 includes the transistor devices 308 and the top wiring connecting the transistor devices 308 to other transistor device 308 and potentially to external components or signal generators.

The die 302 also includes through silicon vias (TSVs) 310. The TSVs 310 are conductive filaments that are fabricated through a semiconductor layer 312 to electrically connect the transistor devices 308 to the backside 304 of the die 302. The TSVs 310 may be fabricated by etching the hole for the via in the semiconductor layer 312 (generally either silicon or a dielectric), lining the hole with a barrier against copper diffusion, then depositing a seed layer prior to filling the via hole with copper using some form of aqueous deposition. The TSVs 310 may be fabricated at any stage (e.g., before the transistor devices 308, concurrently with the transistor devices 308, or after the transistor devices 308). The TSVs 310 are not necessarily drawn to scale, and ratios of length to width of the TSVs 310 may be higher than 30:1.

After the formation/fabrication of the transistor devices 308 and the TSVs 310, the die 302 may be prepared for formation of alignment structures. Such formation may include depositing a mask 314, and patterning and etching holes 316 in the mask 314 using known lithographic patterning and wet/dry etch techniques. That is, the mask 314 may be etched with a process that is selective to the mask 314 but does not etch the semiconductor layer 312 or the TSVs 310 (i.e., any etching of the semiconductor layer 312 or the TSVs 310 only happens at a significantly reduced rate). The holes 316 may be etched into a variety of shapes such as round, square, rectangular, or other regular or irregular hole patterns. The shape of the holes 316 influences the shape of the resulting alignment structure, and may be customized to match alignment structures on a corresponding component.

Figure 4:
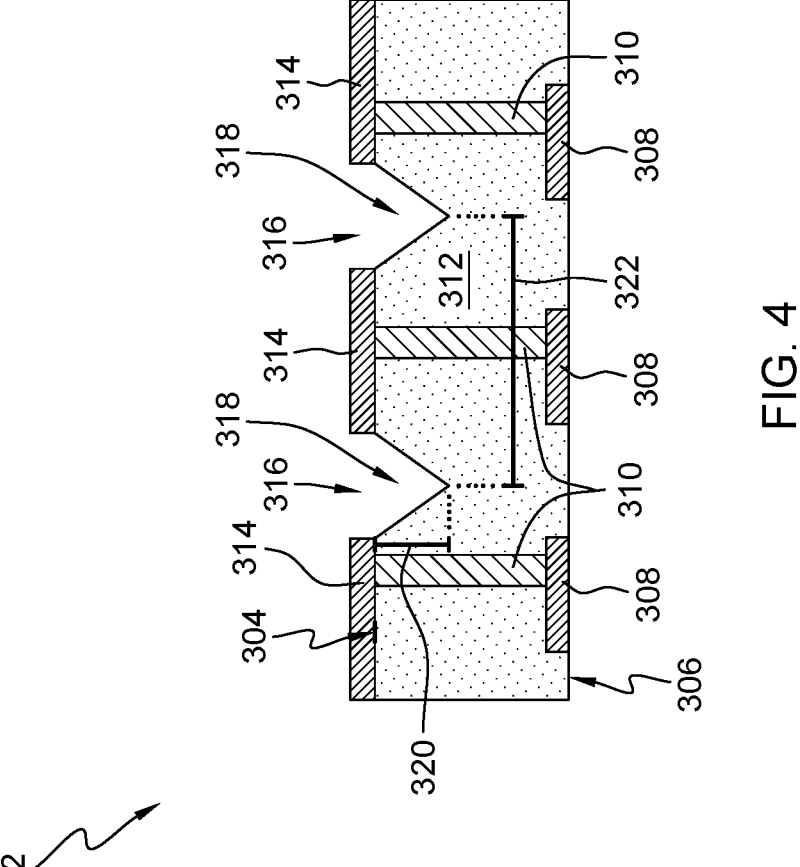
FIG. 4 depicts a cross-sectional schematic side view diagram of the die of FIG. 3, in accordance with one embodiment of the present invention.

FIG. 4 depicts a cross-sectional schematic side view diagram of the die 302 of FIG. 3, in accordance with one embodiment of the present invention. The die 302 is etched to include die alignment structures 318. The die alignment structures 318 may be fabricated with specific features that can be "matched" by corresponding features on a substrate. For example, the die alignment structures 318 may include a cavity (i.e., a feature protruding into the material of a plane) of a particular shape. The shape of the die alignment structures 318 may depend on the shape of the holes 316 etched into the mask 314, and may also depend on the etch process used to etch the die alignment structures 318. That is, a longer etch process (all other variables staying the same) will produce a deeper die alignment structure 318, while a shorter etch process will produce a shallower die alignment structure 318. Different etch process types will produce different shapes of a die alignment structure 318 as well.

In certain embodiments, the die alignment structures 318 may be etched using a crystallographic etch process to produce highly planarized walls that offer precise alignment and matching with a corresponding alignment structure. In etching semiconductor materials such as gallium arsenide or indium phosphide, smooth, specific etching procedures can produce molecularly flat etch walls. Furthermore, selecting a shape and orientation for the holes 316 can control the configuration of these walls to produce vertical, horizontal, or specifically angled walls within the die alignment structure 318. Additionally, again by the choice of an appropriately oriented mask, the etched walls correspond to crystallographic planes and thus, walls corresponding to the same plane are parallel as dictated by the crystal structure of the material being etched.

To produce the desired effect, an appropriate etchant such as KOH (Potassium Hydroxide) is applied to the semiconductor layer 312 for a designated amount of time. The interaction of an appropriate etchant with the semiconductor layer 312 causes differential crystallographic etching (i.e., etching that proceeds in directions dictated by the crystallographic planes of the material being etched) at a rate which strongly depends on the particular plane. By appropriately orienting the holes 316 of the mask 314 on an appropriate crystallographic plane of the semiconductor layer 312, the die alignment structures 318 can have flat feature walls along this plane. The flat feature walls can then be combined to produce a matchable alignment structure 318. In the illustrated embodiment, the die alignment structure 318 includes a tetragonal pyramid shape produced by holes 316 that are square shaped, and a etch process that produces planes at an angle from the plane of the backside 304 of the semiconductor layer 312. The tetragonal pyramid includes a depth 320 determined by the convergence of the angle of the planes, and the shape of the holes 316 in the mask 314. Other shapes (trench, cone, trigonal pyramid, etc.) may be produced using other shapes for the holes 316 and/or other angles for the planes.

The die alignment structures 318 may also be matched based on a spacing between features. For example, the spacing can be a distance 322 between like parts of the die alignment structures 318. In FIG. 4, the distance 322 is illustrated as the distance between the low points of the die alignment structures 318. While the die 302 may include some constraints on the distance 322 between features (e.g., the locations of the TSVs 310), the distance 322 may be customized to facilitate alignment for certain dies 302 and prevent alignment for other dies 302.

Following the formation of the die alignment structures 318, the mask 314 may be removed. The die 302 may also be diced up after the formation of the die alignment structures 318.

Figure 5:
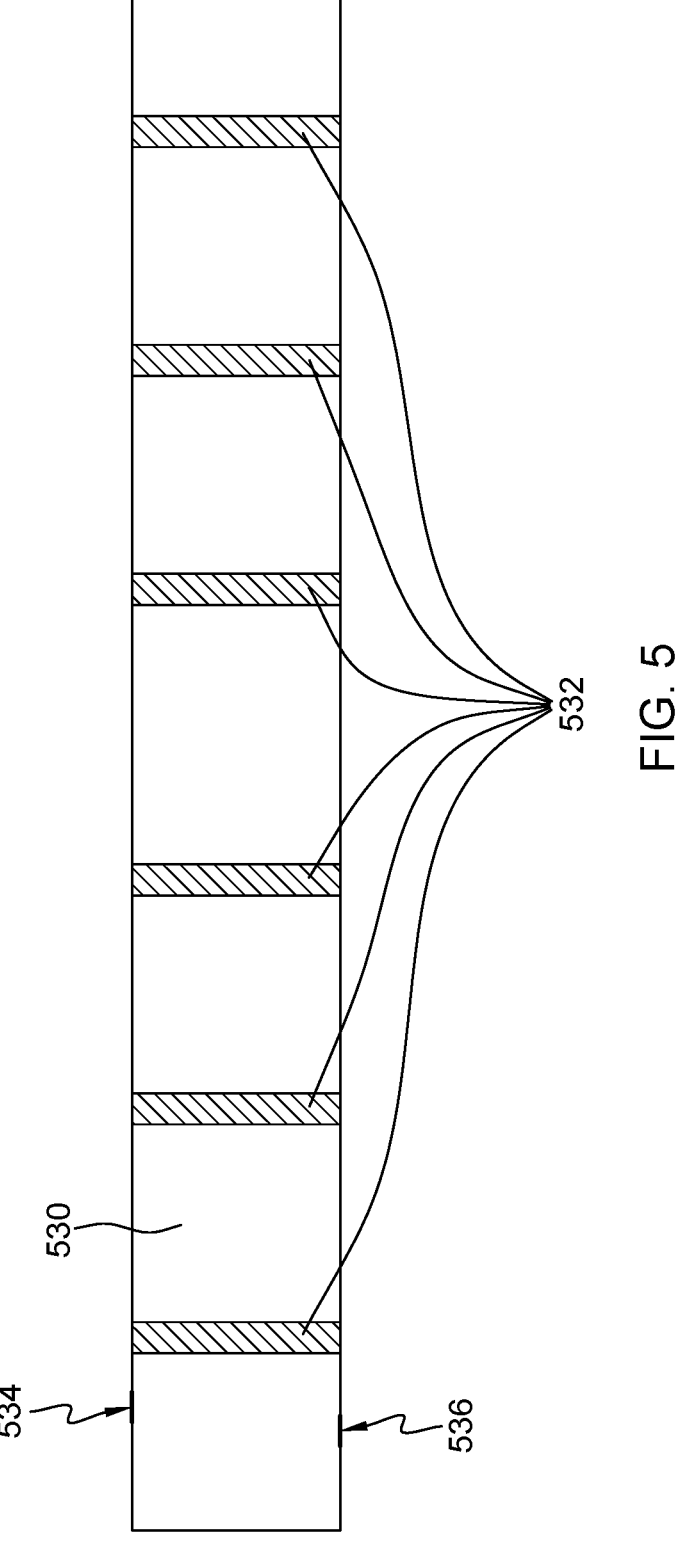
FIG. 5 depicts a cross-sectional schematic side view diagram of a substrate, in accordance with one embodiment of the present invention.

FIG. 5 depicts a cross-sectional schematic side view diagram of a substrate 530, in accordance with one embodiment of the present invention. The substrate 530 may be fabricated from semiconductor material such as silicon. The substrate 530 (separate from the die 302) may also have features formed therein, such as TSVs 532 formed through from a backside 534 to a front side 536. Other features (not illustrated) may also be formed in the substrate 530.

Figure 6:
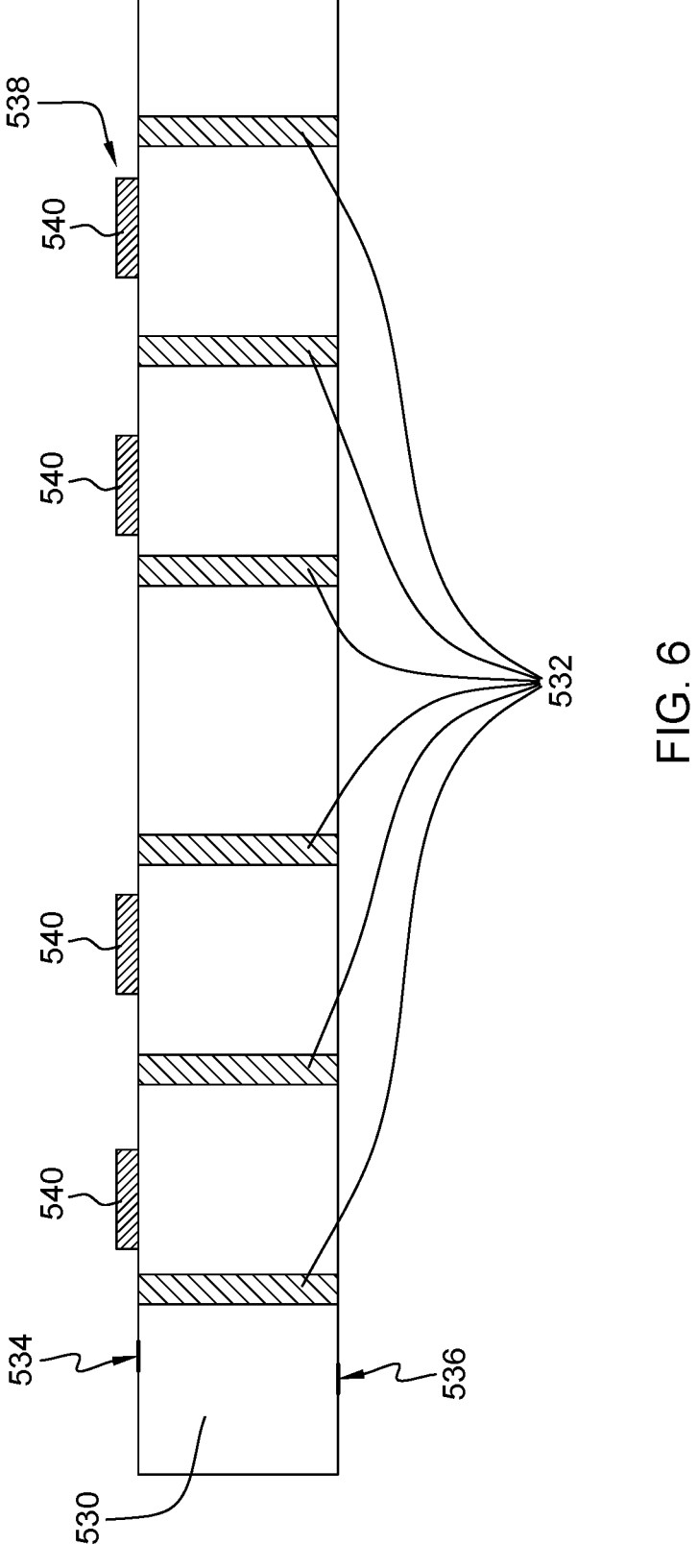
FIG. 6 depicts a cross-sectional schematic side view diagram of the substrate of FIG. 5, in accordance with one embodiment of the present invention.

FIG. 6 depicts a cross-sectional schematic side view diagram of the substrate 530 of FIG. 5, in accordance with one embodiment of the present invention. The substrate 530 has a mask 538 that includes poles 540. The mask 538 has been etched around the poles 540. The mask 538 may be formed from a material such as silicon nitride.

Figure 7:
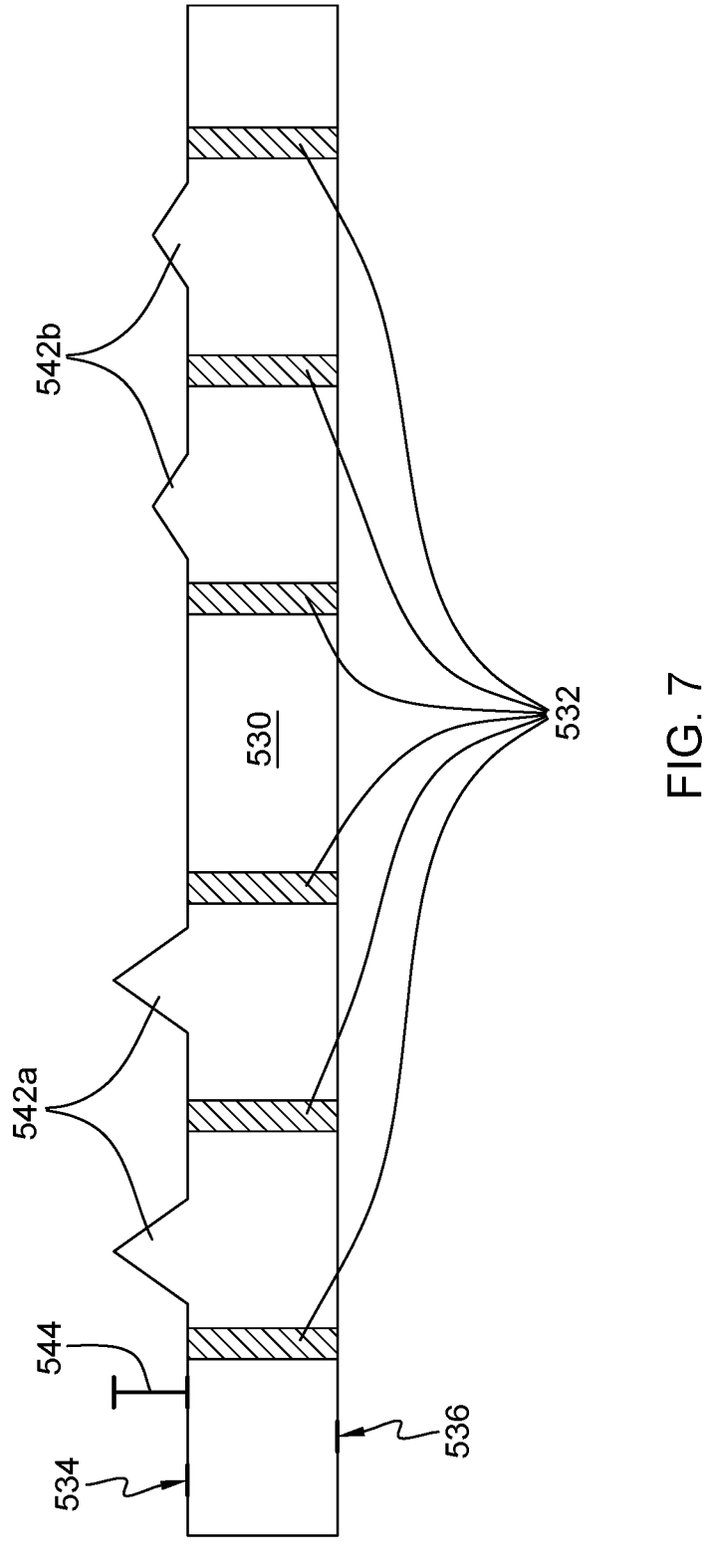
FIG. 7 depicts a cross-sectional schematic side view diagram of the substrate of FIG. 5, in accordance with one embodiment of the present invention.

FIG. 7 depicts a cross-sectional schematic side view diagram of the substrate 530 of FIG. 5, in accordance with one embodiment of the present invention. The substrate 530 has been etched to form first substrate alignment structures 542a and second substrate alignment structures 542b on the backside 534. The substrate alignment structures 542a, b are formed by slowing, blocking, or otherwise controlling the etching of the substrate 530 with the poles 540. For example, a crystallographic preferential etch may be used to etch the substrate 530 and the poles 540 simultaneously, with the extra material of the poles 540 creating a spike protruding from the backside 534. Specifically, the backside 534 is etched down a distance 544 from the original plane of the backside 534, while only portions of the substrate alignment structures 542a, b are etched. As with the die alignment structures 318, the substrate alignment structures 542a, b may be formed with flat planes having specific angles relative to the backside 534 that match the angles of the die alignment structures 318 in the die 302. The TSV 532 can also be etched flush to surface 534 to avoid them sticking out from surface 534.

Figure 8:
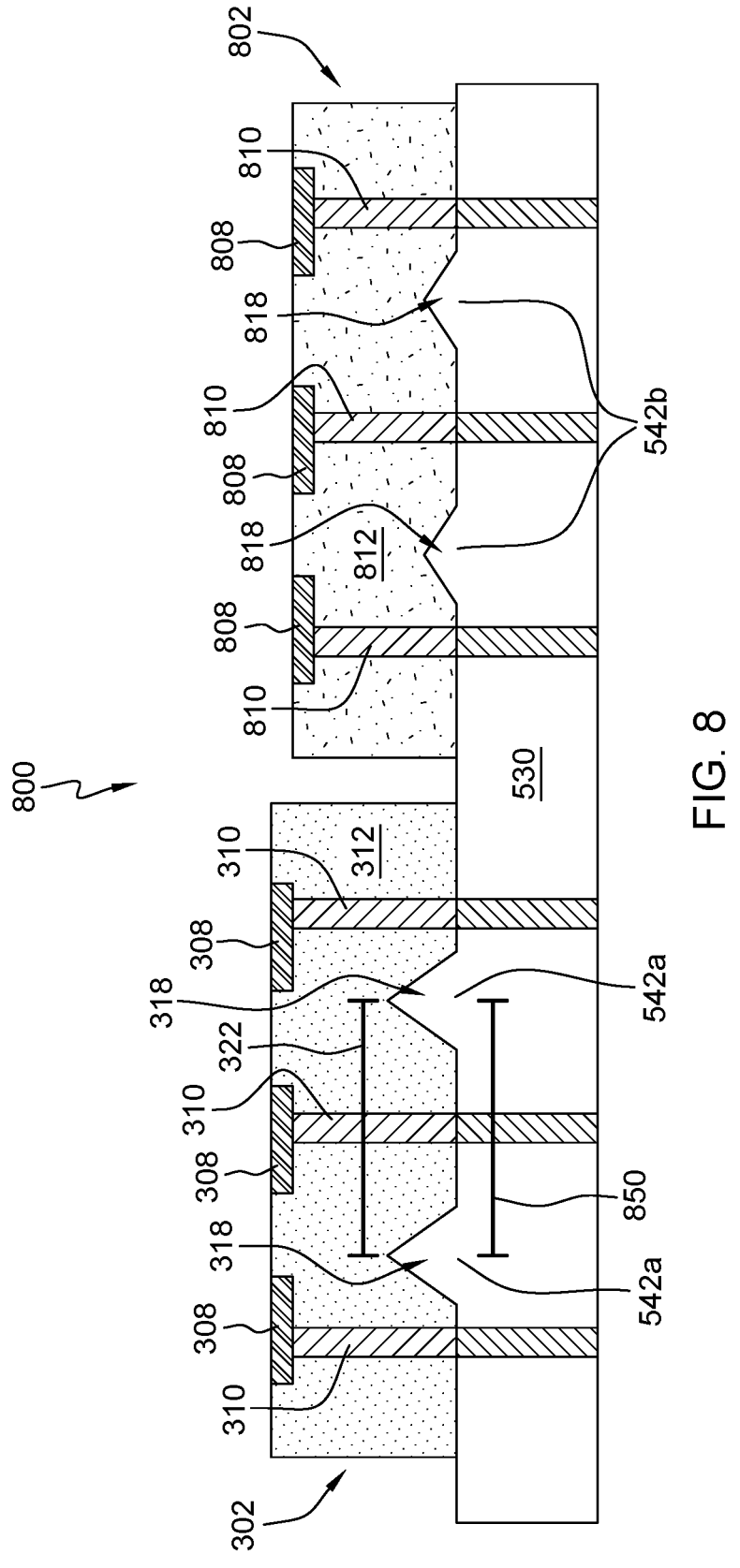
FIG. 8 depicts a cross-sectional schematic side view diagram of a semiconductor structure, in accordance with one embodiment of the present invention.

FIG. 8 depicts a cross-sectional schematic side view diagram of a semiconductor structure 800 having the substrate 530 of FIG. 5 and the first die 302 of FIG. 4, in accordance with one embodiment of the present invention. The substrate 530 has the first die 302 and a second die 802 aligned and attached using the first substrate alignment structures 542a and the second substrate alignment structures 542b. Attachment of the first die 302 and the second die 802 may be completed using known die attachment methods.

The second die 802 may be formed similarly to the first die 302, with transistor devices 808 and TSVs 810 formed on a semiconductor layer 812. The second die 802 also includes second die alignment structures 818 that may be formed with different shape or spacing than the first die alignment structures 318. In certain embodiments, the second die alignment structures 818 may be formed using different masking and etching methods from the first die alignment structures 318, or may be formed using the same masking and etching methods with which the first die alignment structures 318 were formed.

Each of the first die alignment structure 318 and the second die alignment structures 818 are matched to the first substrate alignment structures 542a and the second substrate alignment structures 542b respectively. That means that the shape, spacing, and other features of the first die alignment structures 318 are similar but in an opposite orientation to the shape, spacing, and other features of the first substrate alignment structures 542a; and the shape, spacing, and other features of the second die alignment structures 818 are similar but in an opposite orientation to the shape, spacing, and other features of the second substrate alignment structures 542b. For example, the depth 320 of the cavity of the of the first die alignment structure 318 is the same as the distance 544 of the spike of the first substrate alignment structure 542a etched down from the backside 534; and the distance 322 of the spacing between features of the first die alignment structures 318 is the same as a distance 850 between the features (e.g., illustrated in FIG. 8 as the distance between the apexes of the spikes of the first substrate alignment structures 542a). The angles of the cavity of the first die alignment structure 318 and the angles of the spike of the first substrate alignment structures 542a also are the same (i.e., within a reasonable tolerance).

Figure 9:
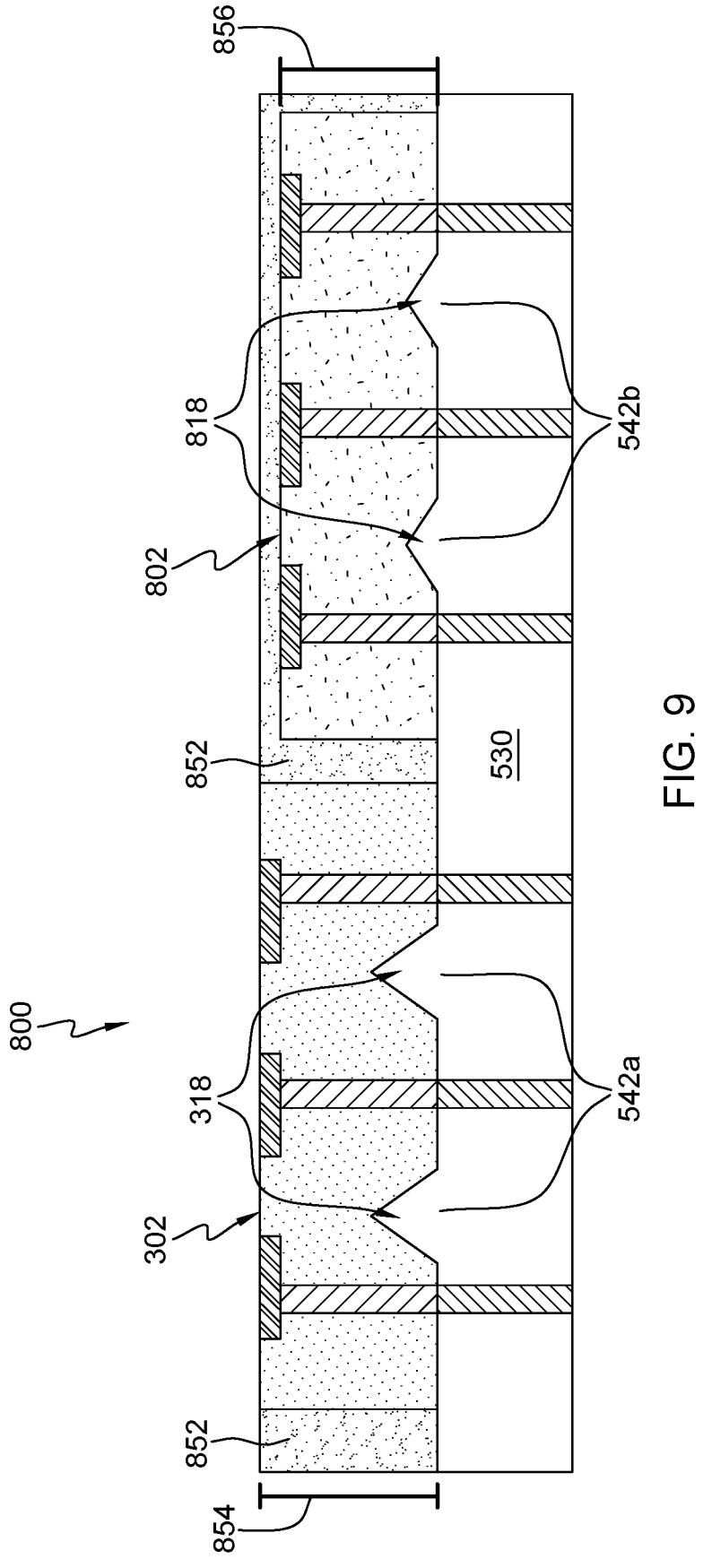
FIG. 9 depicts a cross-sectional schematic side view diagram of a semiconductor structure of FIG. 8, in accordance with one embodiment of the present invention.

FIG. 9 depicts a cross-sectional schematic side view diagram of a semiconductor structure 800 of FIG. 8 having the substrate 530 of FIG. 5 and the first die 302 of FIG. 4, in accordance with one embodiment of the present invention. The semiconductor structure 800 includes a dielectric fill 852 formed over the substrate 530. The dielectric fill 852 is formed using known techniques for layer fabrication such as chemical vapor deposition (CVD) or spin on. The dielectric fill 852 may then be planarized and polished so that the semiconductor structure 800 has a smooth and flat top surface. That is, the dielectric fill 852 covers a difference between a height 854 of the first die 302 and height 856 of the second die 802. In certain embodiments, the semiconductor structure 800 may include many different types of dies (e.g., additionally to the first die 302 and the second die 802) having many different heights.

Figure 10:
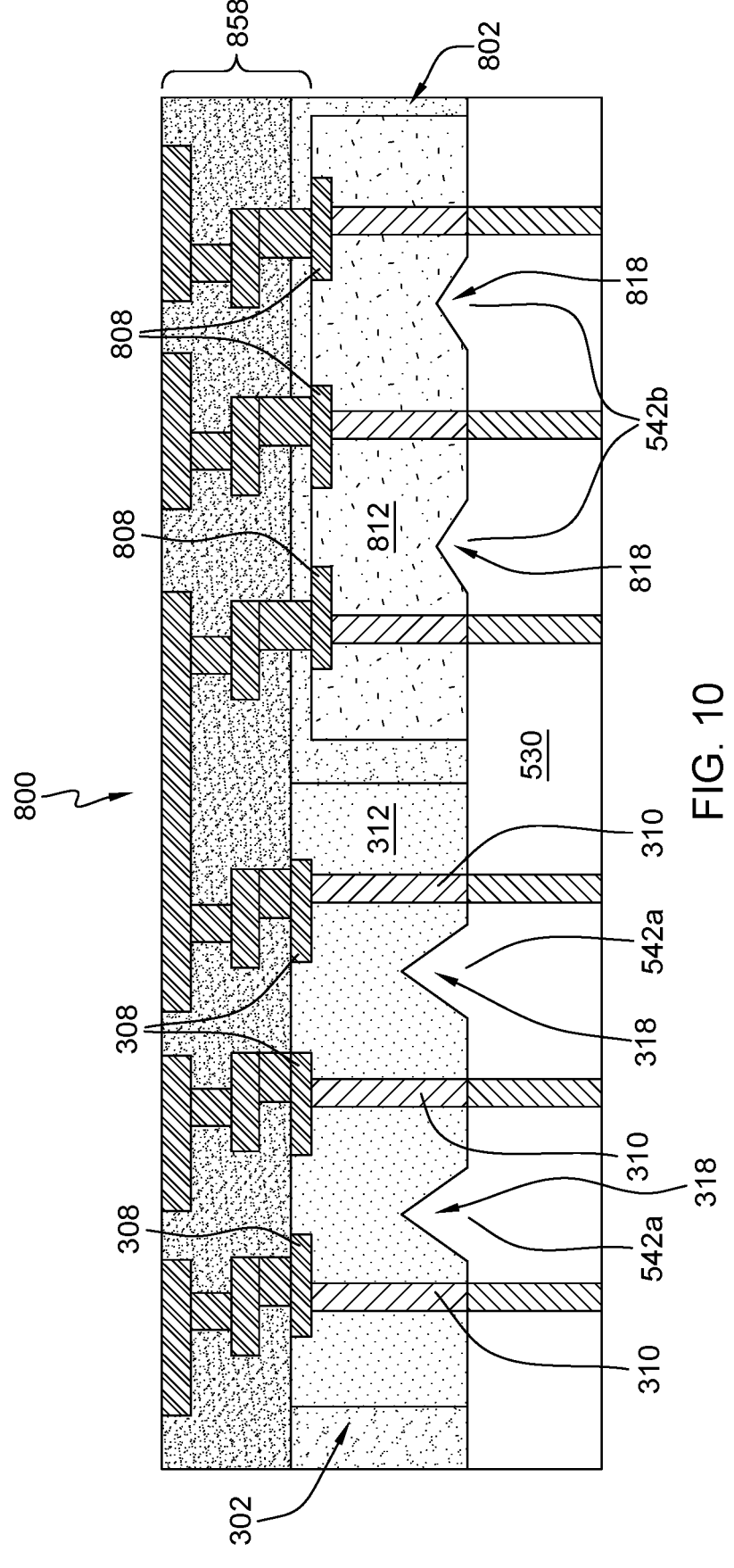
FIG. 10 depicts a cross-sectional schematic side view diagram of a semiconductor structure of FIG. 8, in accordance with one embodiment of the present invention.

FIG. 10 depicts a cross-sectional schematic side view diagram of the semiconductor structure 800 of FIG. 8 having the substrate 530 of FIG. 5 and the first die 302 of FIG. 4, in accordance with one embodiment of the present invention. The semiconductor structure 800 includes a patterned wiring 858 fabricated above the first die 302 and the second die 802. The patterned wiring 858 includes metal levels of wires and vias that power and/or convey signals to the transistor devices 308, 808. The patterned wiring 858 is cohesive between the first die 302 and the second die 802. That is, the transistor device 308 of the first die 302 may communicate, receive, or send signals between any of the other transistor device 308 of the first die 302, between any of the transistor devices 808 of the second die 802, or any other transistor devices (not illustrated) of other dies attached to the substrate 530. The dielectric fill 852 enables the metal levels of the patterned wiring 858 to be fabricated evenly and without compensating for the differences between the height 854 of the first die 302 and the height 856 of the second die 802.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A semiconductor structure, comprising:
   a substrate comprising a first substrate alignment structure comprising an angled wall;
   a first die comprising a first die alignment structure, wherein the first die is attached to the substrate with the first substrate alignment structure, and the first die alignment structure comprises a crystallographic plane matched to the angled wall of the first substrate alignment structure;
   a second die comprising a second die alignment structure, wherein the substrate comprises a second substrate alignment structure, and wherein the second die is attached to the substrate with the second substrate alignment structure matched to the second die alignment structure and unmatched with the first die alignment structure; and
   patterned wiring above and electrically coupled to the first die and the second die, wherein the first die directly contacts the patterned wiring and the second die is covered by a dielectric fill layer.

2. The semiconductor structure of claim 1, wherein the first substrate alignment structure comprises a cavity, and the first die alignment structure comprises a spike.

3. The semiconductor structure of claim 1, wherein the first die alignment structure comprises a cavity, and the first substrate alignment structure comprises a spike.

4. The semiconductor structure of claim 1, wherein the first substrate alignment structure is matched to the first die alignment structure based on a selection from the group consisting of:
   a first shape of the first substrate alignment structure that matches a second shape of the first die alignment structure, and
   a first spacing between features of the first substrate alignment structure matching a second spacing between features of the first die alignment structure.

5. The semiconductor structure of claim 1, wherein the first die comprises a first set of through-silicon vias (TSVs), the substrate comprises a second set of TSVs that align to the first set of TSVs.

6. A semiconductor structure, comprising:
   a substrate comprising first substrate alignment structures comprising a first angled wall and second substrate alignment structures comprising a second angled wall, wherein the second angled wall is at a different angle than the first angled wall;
   a first set of dies comprising first die alignment structures, wherein the first set of dies are attached to the substrate with the first die alignment structures comprising a crystallographic plane matched to the first angled wall;
   a second set of dies comprising second die alignment structures, wherein the second set of dies is attached to the substrate with the second die alignment structures comprising a crystallographic plane matched to the second angled wall; and
   patterned wiring above and electrically coupled to the first set of dies and the second set of dies, wherein the first set of dies directly contact the patterned wiring and the second set of dies is covered by a dielectric fill.

7. The semiconductor structure of claim 6, wherein the first substrate alignment structures comprise a hole, and the first die alignment structures comprises a spike.

8. The semiconductor structure of claim 6, wherein the first die alignment structures comprise a hole, and the first substrate alignment structures comprise a spike.

9. The semiconductor structure of claim 6,
wherein the first set of dies comprise a first height, the
second set of dies comprise a second height different
from the first height, and the dielectric fill covers a
difference between the first height and the second
height.

10. The semiconductor structure of claim 6, wherein the
first substrate alignment structures are matched to the first
die alignment structures based on a selection from the group
consisting of:
a first shape of the first substrate alignment structures that
matches a second shape of the first die alignment
structures, and
a first spacing between features of the first substrate
alignment structures matching a second spacing
between features of the first die alignment structures.

\* \* \* \* \*